United States Patent
Lewin et al.

(10) Patent No.: US 10,522,442 B2
(45) Date of Patent: Dec. 31, 2019

(54) DISSIPATING HEAT FROM AN ELECTRONIC DEVICE IN A PROTECTIVE HOUSING

(71) Applicant: Performance Motion Devices, Inc., Westford, MA (US)

(72) Inventors: Emanuel Gustav Lewin, Lincoln, MA (US); Peter Fransiscus Vandermeulen, Newburyport, MA (US); Peng Li, Bolton, MA (US); David Chanan Horovitch Shmelzer, Wayland, MA (US); Ahmad Radey Shouman, Chelmsford, MA (US); Guy Richard Raiti, Atkinson, NH (US)

(73) Assignee: Performance Motion Devices, Inc., Westford, MA (US)

( * ) Notice: Subject to any disclaimer, the term of this patent is extended or adjusted under 35 U.S.C. 154(b) by 0 days.

(21) Appl. No.: 15/637,873

(22) Filed: Jun. 29, 2017

(65) Prior Publication Data

US 2019/0006262 A1    Jan. 3, 2019

(51) Int. Cl.
*H01L 23/373* (2006.01)
*H01L 23/40* (2006.01)
(Continued)

(52) U.S. Cl.
CPC ...... *H01L 23/3736* (2013.01); *H01L 23/3735* (2013.01); *H01L 23/4006* (2013.01);
(Continued)

(58) Field of Classification Search
CPC ............ H01L 23/3736; H01L 23/4006; H01L 23/3735; H01L 2924/0002; H05K 7/20418
(Continued)

(56) References Cited

U.S. PATENT DOCUMENTS

| 8,288,658 B2 * | 10/2012 | Uchida | B62D 5/0406 174/252 |
| 2009/0086431 A1 * | 4/2009 | Sakamoto | H05K 7/20009 361/695 |

(Continued)

*Primary Examiner* — Jayprakash N Gandhi
*Assistant Examiner* — Stephen S Sul
(74) *Attorney, Agent, or Firm* — Anderson Gorecki LLP

(57) ABSTRACT

An enclosed digital power amplifier has features for accommodating thermal cycling. The digital power amplifier includes an amplifier board and a controller board, both of which are in a protective housing. The amplifier board includes electronic components mounted on a copper circuit layer that is disposed on a dielectric layer that is disposed on an aluminum substrate layer. The housing includes slotted mounting projections that extend from sidewalls to isolate fasteners from the aluminum substrate layer, and thereby accommodate expansion of the aluminum substrate layer while the digital power amplifier is secured to a surface by the fasteners. Bottom edges of the sidewalls contact a top outer edge of the amplifier board. The mounting projections contact side outer edges of the first circuit board. At least a portion of the aluminum substrate layer extends beyond the bottom edges of the sidewalls of the housing, forming an end wall, such that the housing does not inhibit thermally coupling the aluminum substrate layer to another surface such as a heat exchanger.

20 Claims, 9 Drawing Sheets

(51) Int. Cl.
*H05K 7/20* (2006.01)
*H01L 23/42* (2006.01)

(52) U.S. Cl.
CPC ...... *H05K 7/20418* (2013.01); *H01L 23/3737* (2013.01); *H01L 23/42* (2013.01); *H01L 2924/0002* (2013.01)

(58) Field of Classification Search
USPC .......... 361/810, 701, 702, 679.54, 719, 720, 361/736, 796, 709
See application file for complete search history.

(56) References Cited

U.S. PATENT DOCUMENTS

| | | | | |
|---|---|---|---|---|
| 2009/0086454 A1* | 4/2009 | Sakamoto | .............. | H05K 1/144 361/796 |
| 2009/0086455 A1* | 4/2009 | Sakamoto | .............. | H05K 1/144 361/796 |
| 2009/0091899 A1* | 4/2009 | Saito | ................. | H01L 23/24 361/752 |
| 2009/0103276 A1* | 4/2009 | Sakamoto | .............. | H05K 1/144 361/792 |
| 2014/0285973 A1* | 9/2014 | Hong | ................. | H05K 5/0221 361/709 |

\* cited by examiner

Amplifier Board 200

DISSIPATING HEAT FROM AN ELECTRONIC DEVICE IN A PROTECTIVE HOUSING

BACKGROUND

The subject matter of this disclosure is generally related to heat dissipation for electronic devices. Heatsinks are commonly used to dissipate heat from electronic components and devices that generate excessive heat. A typical heatsink is made from a thermally conductive material such as aluminum, copper, steel, and alloys thereof. The heatsink is thermally coupled to the component or device that is being protected. For example, the heatsink may be disposed against a flat surface of the component or device. Heat that is transferred from the component or device to the heatsink is dissipated into the air or a liquid coolant. The heatsink may have significant mass and features that increase the heat-dissipating surface area within a given form factor. For example, the heatsink may be relatively heavy and include arrays of cooling fins.

Aluminum printed circuit boards are also known. An aluminum printed circuit board may include a copper circuit layer that is separated from an aluminum substrate layer by a thin dielectric layer. The aluminum substrate layer conducts heat more efficiently than FR-4 and other conventional epoxy-fiberglass substrates. The aluminum substrate layer may be coupled to a heatsink.

SUMMARY

At least some aspects of this disclosure are predicated in part on recognition of technical problems associated with securing aluminum printed circuit boards to a heat sink. There are various physical differences between aluminum substrates and conventional epoxy-fiberglass substrates. For example, the coefficient of thermal expansion of aluminum is greater than that of conventional epoxy-fiberglass, and the materials have different thermal conductivity and strength. These differences may be particularly problematic when the coupled components generate significant amounts of excess heat, are enclosed in a housing with other sensitive components, are enclosed in a housing that must be firmly secured to a heatsink and other element, are subjected to motion or vibration, are surface mounted, and combinations thereof. For example and without limitation, localized mechanical and thermal stress may cause deformation of the circuit board that damages electronic components.

All examples, aspects and features mentioned in this document can be combined in any technically possible way.

In accordance with an aspect an apparatus comprises: an electronic device comprising: a first circuit board comprising a plurality of electronic components connected to a copper circuit layer that is disposed on a dielectric layer that is disposed on an aluminum substrate layer; a housing comprising a first end wall, a first sidewall, a second sidewall, a third sidewall, and a fourth sidewall, the first sidewall comprising a first mounting projection, and the second sidewall comprising a second mounting projection, the first mounting projection comprising a first opening for receiving a first fastener, the second mounting projection comprising a second opening for receiving a second fastener; wherein bottom edges of the first sidewall, second sidewall, third sidewall and fourth sidewall contact a top outer edge of the first circuit board and the first and second mounting projections contact first and second side outer edges of the first circuit board, at least a portion of the aluminum substrate layer extending beyond the bottom edges of the sidewalls of the housing, the aluminum substrate layer forming a second end wall of the electronic device. In some implementations the first circuit board comprises an amplifier. In some implementations the electronic device further comprises a second circuit board coupled to the first circuit board, the second circuit board comprising a controller. In some implementations the second circuit board comprises pins that extend from the second circuit board through the housing. In some implementations the first opening comprises a slot through which a shank of the first fastener is inserted. Some implementations comprise a flat shelf proximate to the slot. Some implementations comprise a metal insert seated on the shelf. Some implementations comprise a flexible adhesive that adheres the second circuit board to the housing. In some implementations the housing comprises an uneven surface to which the flexible adhesive is adhered.

In accordance with an aspect a method comprises: coupling a first circuit board to a heat exchanger, the first circuit board comprising a plurality of electronic components connected to a copper circuit layer that is disposed on a dielectric layer that is disposed on an aluminum substrate layer, by: placing the first circuit board in a housing, the housing comprising a first end wall, a first sidewall, a second sidewall, a third sidewall, and a fourth sidewall, the first sidewall comprising a first mounting projection, and the second sidewall comprising a second mounting projection, the first mounting projection comprising a first opening for receiving a first fastener, the second mounting projection comprising a second opening for receiving a second fastener, wherein bottom edges of the first sidewall, second sidewall, third sidewall and fourth sidewall contact a top outer edge of the first circuit board and the first and second mounting projections contact first and second side outer edges of the first circuit board, at least a portion of the aluminum substrate layer extending beyond the bottom edges of the sidewalls of the housing, the aluminum substrate layer forming a second end wall; and fastening the housing to the heat exchanger via the first and second mounting projections. In some implementations the first circuit board comprises an amplifier, and the method comprises coupling a second circuit board to the first circuit board, the second circuit board comprising a controller. In some implementations the second circuit board comprises pins that extend from the second circuit board through the housing, and the method comprises coupling a device to the second circuit board via the pins. In some implementations the first opening includes a slot, and the method comprises inserting a shank of the first fastener through the slot. Some implementations comprise seating a head of the first fastener against a flat shelf proximate to the slot. Some implementations comprise seating a head of the first fastener against a metal insert seated against a flat shelf proximate to the slot. Some implementations comprise adhering the second circuit board to the housing with a flexible adhesive. Some implementations comprise adhering the flexible adhesive to an uneven surface formed on the housing.

In accordance with an aspect a digital power amplifier device comprises: a first circuit board comprising an amplifier that comprises a plurality of electronic components connected to a copper circuit layer that is disposed on a dielectric layer that is disposed on an aluminum substrate layer; a second circuit board coupled to the first circuit board, the second circuit board comprising a controller; a housing comprising a first end wall, a first sidewall, a second sidewall, a third sidewall, and a fourth sidewall, the first sidewall comprising a first mounting projection, and the second sidewall comprising a second mounting projection, the first mounting projection comprising a first opening for receiving a first fastener, the second mounting projection comprising a second opening for receiving a second fastener; wherein bottom edges of the first sidewall, second sidewall, third sidewall and fourth sidewall contact a top outer edge of the first circuit board and the first and second mounting projections contact first and second side outer edges of the first circuit board, at least a portion of the aluminum substrate layer extending beyond the bottom edges of the sidewalls of the housing, the aluminum substrate layer forming a second end wall of the electronic device; and wherein the second circuit board comprises pins that extend from the second circuit board through the housing. In some implementations the first opening comprises a slot through which a shank of the first fastener is inserted. Some implementations comprise a metal insert seated against a flat shelf proximate to the slot.

Some implementations may provide advantages over previous designs, although no advantage should be viewed as limiting the scope of the invention. For example, mounting projections may provide at least partial mechanical and thermal isolation between fasteners and the amplifier board. Because the mounting projections extend outwardly from the housing sidewall, and because the housing is more pliable than the aluminum substrate layer, overtightening of the fastener causes deflection of the mounting projection without causing the amplifier board to deflect out-of-plane. Further, the housing sidewall may be deflected by expansion of the amplifier board in response to heat without causing the amplifier board to deflect out-of-plane. Further, the absence of direct contact between the aluminum substrate of the amplifier board, fasteners and heat exchanger may help to avoid localized temperature deltas that might induce thermal expansion stresses. These features may be advantageous because deflection of the amplifier board that causes the circuit layer to become non-planar, or have localized stresses or expansion deltas, may result in damage to the components that are mounted thereon. Such damage may be particularly insidious when inflicted upon components such as the ceramic capacitors because small fractures in the ceramic material can lead to moisture intrusion which, over time, can cause the capacitor to fail in a short circuit type state. In addition to isolating material stresses caused by thermal effects, features may isolate localized material stress in the aluminum substrate that may be caused by direct contact of the fasteners with the aluminum substrate. This reduces the need for more precise monitoring of torque on the screws when attaching the amplifier unit to a heat sink or other circuit board.

DETAILED DESCRIPTION

Figure 1:
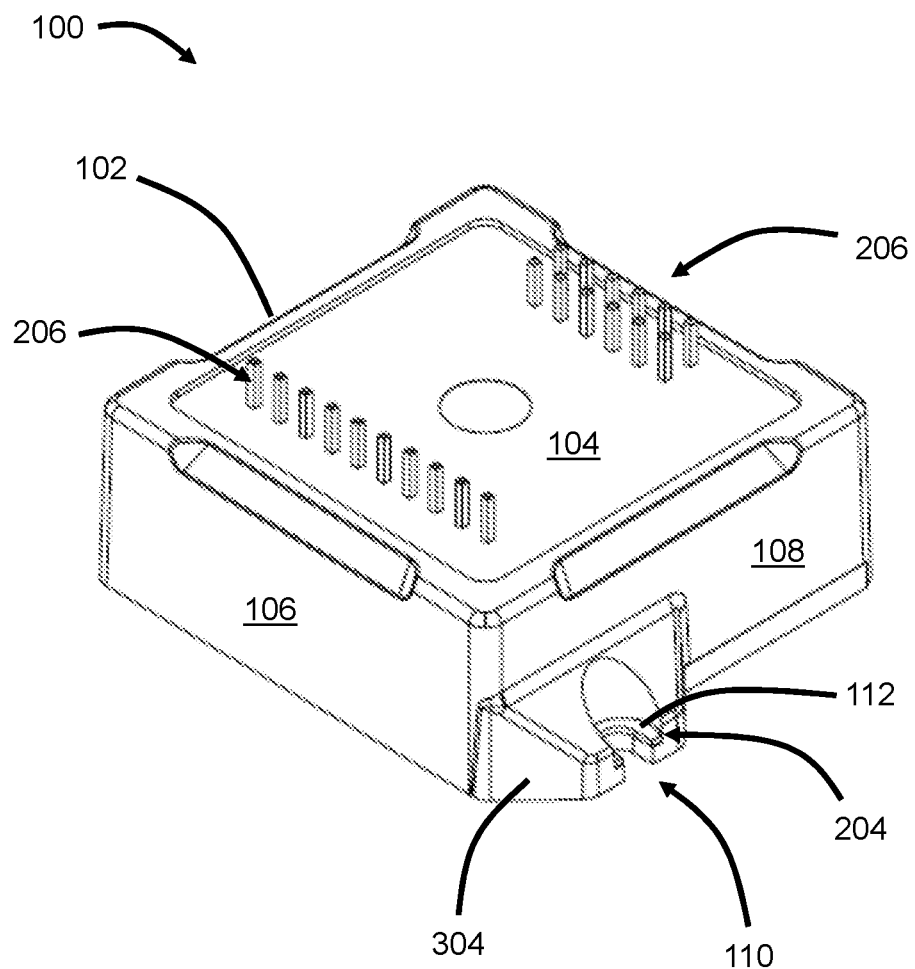
FIG. 1 illustrates is an isometric view of a digital power amplifier.
Figure 2:
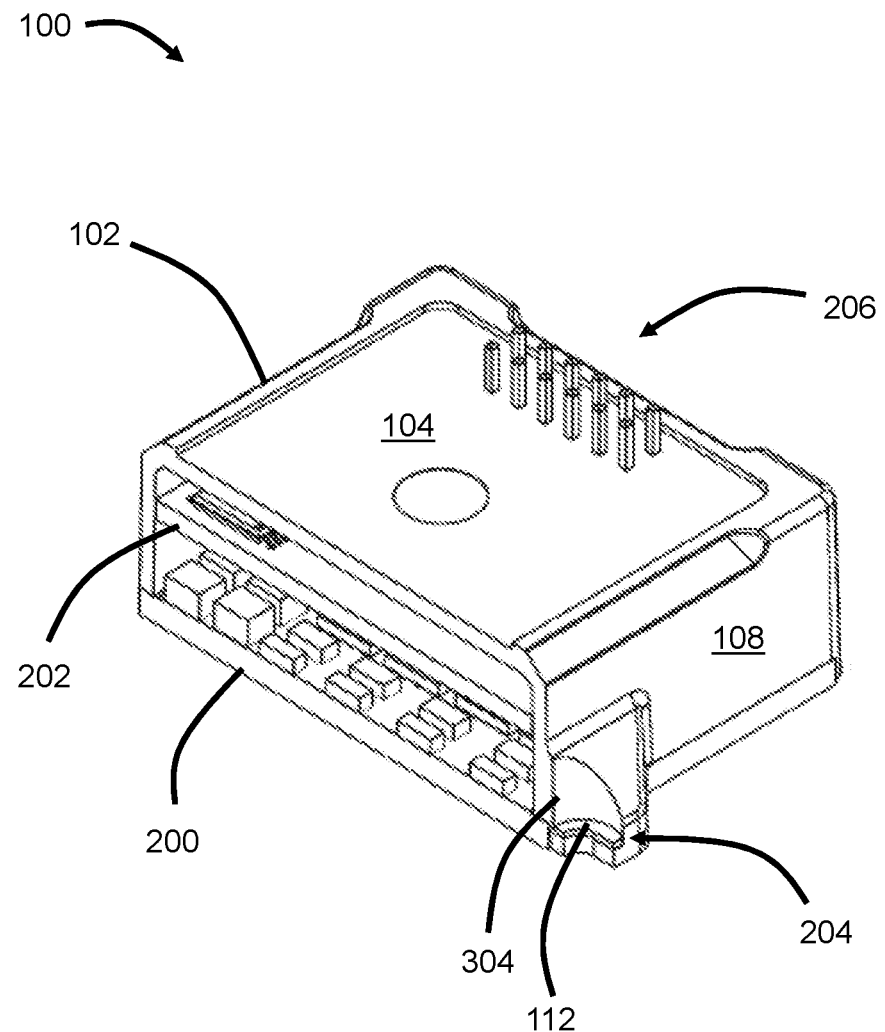
FIG. 2 is a cutaway view of the digital power amplifier of FIG. 1.

FIGS. 1 and 2 illustrate a digital power amplifier 100. Although a digital power amplifier will be described herein to provide context, inventive aspects disclosed herein have more general applicability to a wide variety of circuits and devices that generate excessive heat and require protective housings. In the illustrated example the digital power amplifier 100 includes an amplifier board 200 and a controller board 202, both of which are disposed at least partly in a protective housing 102. As will be described in greater detail below, the digital power amplifier is thermally coupled with a heat exchanger via the amplifier board 200. Further, the housing 102 is used to secure the amplifier in place, e.g. to the heat exchanger. This arrangement provides at least some mechanical and thermal isolation between the amplifier board and fasteners that are used to secure the power amplifier device in place.

The illustrated controller board 202 includes a copper circuit layer that is disposed on an epoxy-fiberglass (e.g. FR-4) dielectric substrate layer. However, the controller board may include multiple circuit layers, ground planes, power planes and other layers in any combination. Electronic components are mounted on the outer circuit layer. For example and without limitation, some or all components may be surface mounted on the circuit layer. The electronic components may include but are not limited to microprocessors, microcontrollers, ASICs (application specific integrated circuits), PGAs (programmable gate arrays), memory chips and other components that are used to implement the logic and program code that controls the amplifier board 200, e.g. for motion control such as by controlling a device such as a DC motor. The controller board 202 may be electrically and mechanically coupled to the amplifier board 200 via pins that electrically interconnect individual conductors and provide mechanical support. The pins may be soldered, friction fitted into connectors or implemented in any other of a wide variety of different ways. The controller board may be separated from the amplifier board by a predetermined volume of airspace that provides some thermal and mechanical isolation. Pins 206 that connect the controller board 202 to another circuit board, component, controlled load or device extend outside of the protective housing 102 through holes. Although the pins are shown extending from a top (end) surface opposite to the amplifier board, in other implementations the pins may extend from one or more sidewalls of the housing.

Figure 3:
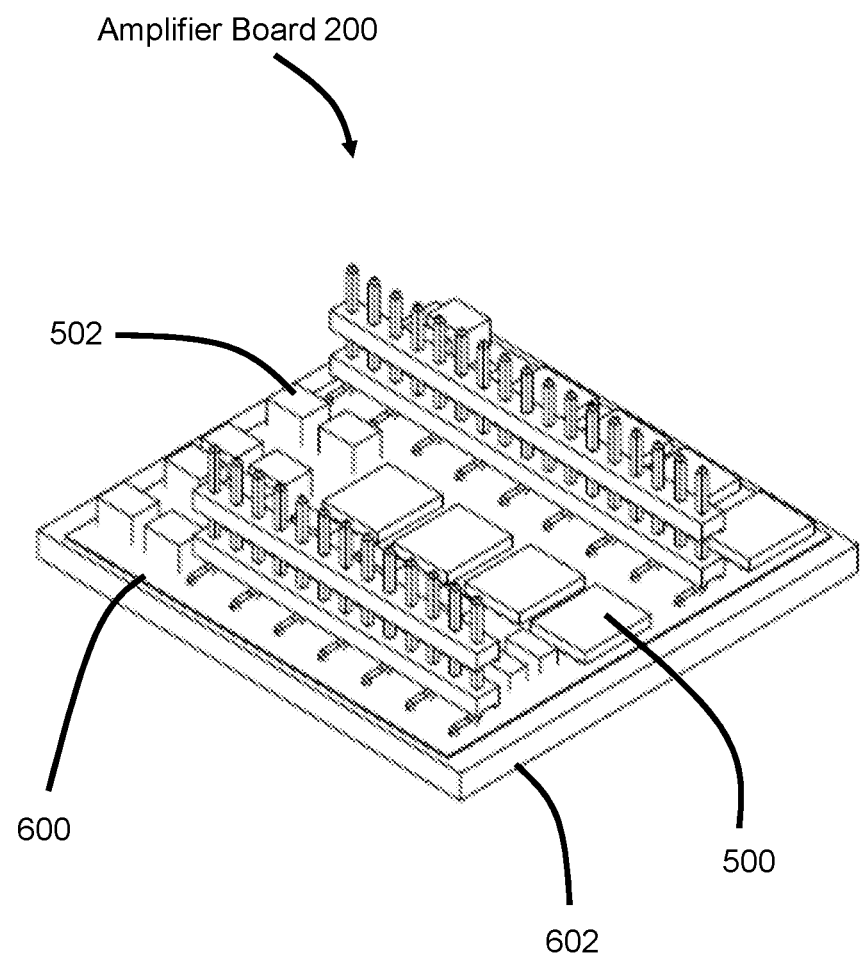
FIG. 3 illustrates the amplifier board.
Figure 4:
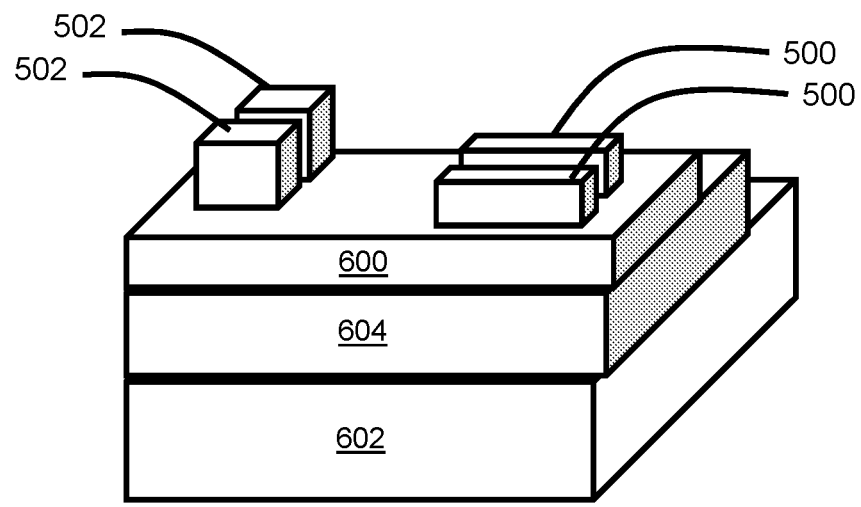
FIG. 4 illustrates the layers of the amplifier board.

Referring now to FIGS. 3 and 4, the amplifier board 200 includes a copper circuit layer 600 that is separated from an aluminum substrate layer 602 by a dielectric layer 604. Electronic components are mounted on the circuit layer 600. For example and without limitation, some or all components may be surface mounted on the circuit layer. The electronic components may include transistors 500 (e.g. and without limitation MOSFETs), capacitors 502, resistors, inductors, and other electronic components. In general, the amplifier board, and specifically the transistors 500, generate heat in amounts that need to be transferred away from the amplifier device. The dielectric layer 604 is thin enough that heat transfer from the heat generating components to the aluminum substrate layer 602 is suitable for transferring heat away from the components. The thicknesses of the various layers and other aspects are implementation details that are within the capabilities of those of ordinary skill in art.

Figure 5:
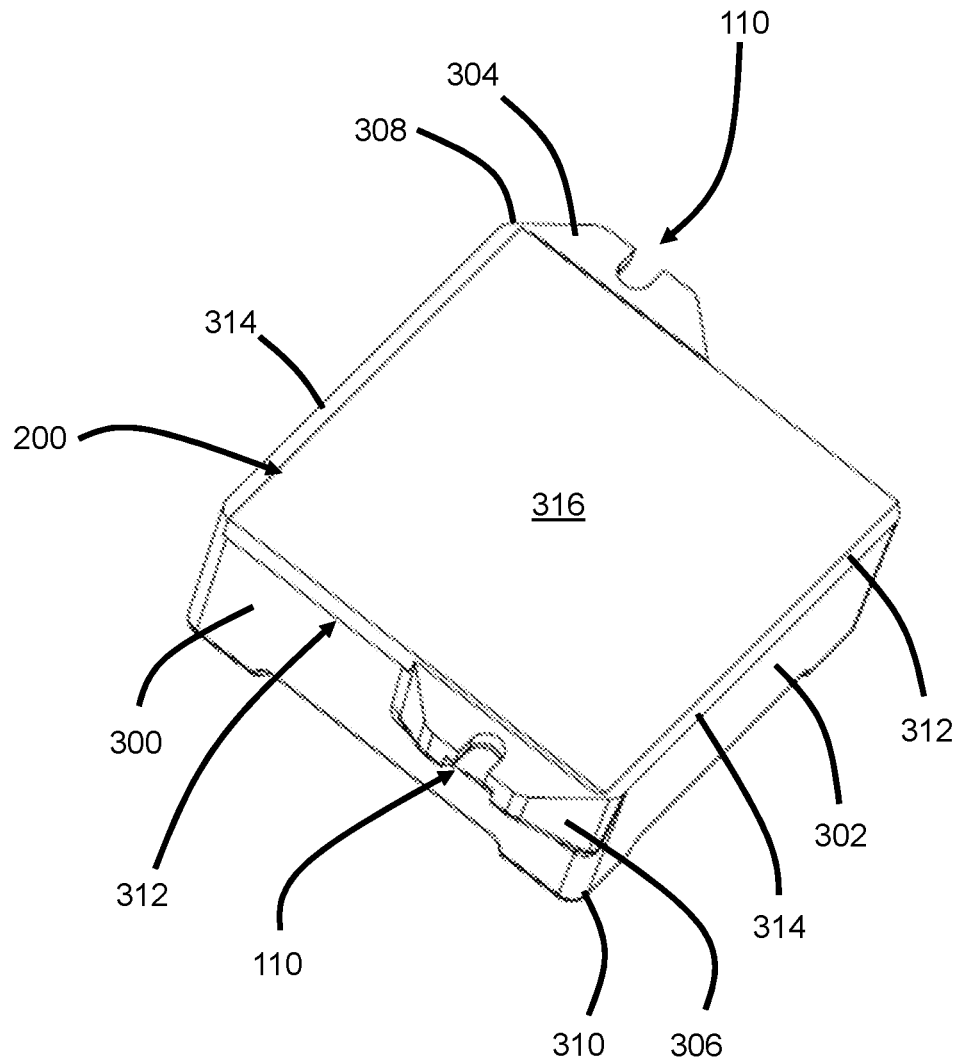
FIG. 5 illustrates the bottom of the digital power amplifier.
Figure 6:
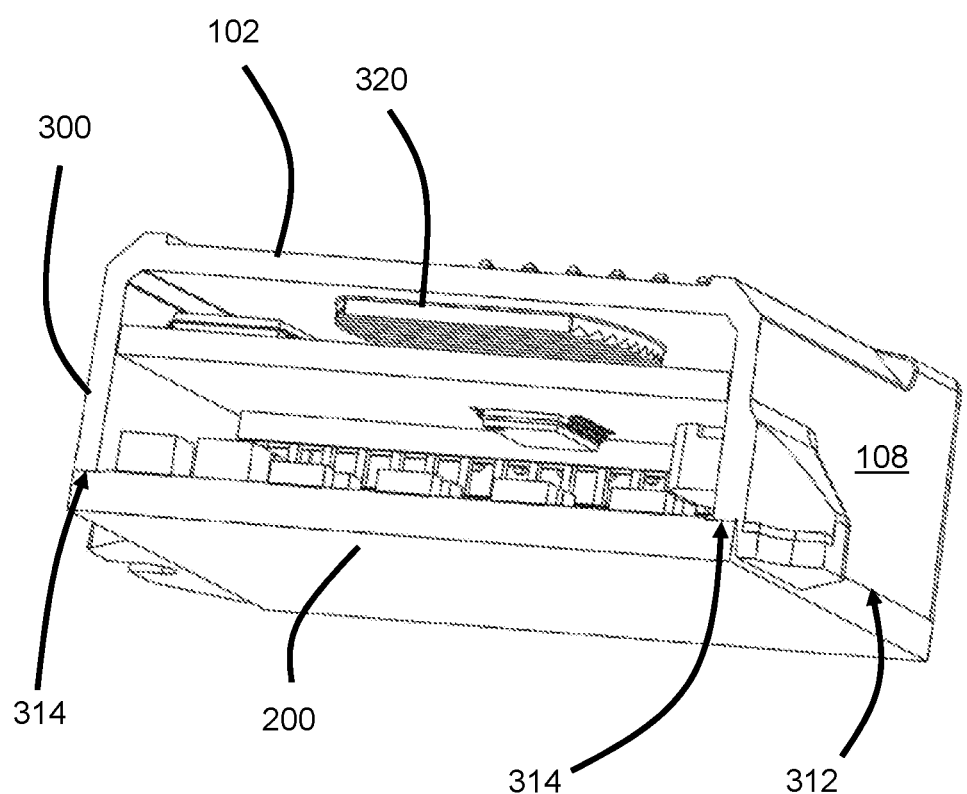
FIG. 6 is another cutaway view of the digital power amplifier of FIG. 1.

Referring now to FIGS. 1, 5 and 6, the protective housing 102 includes a top (end) wall 104 and four sidewalls 106, 108, 300, 302. The sidewalls are oriented at right angles relative to the top wall. As will be discussed below, the amplifier may be mounted in a variety of different ways so the use of the terms "top" and "bottom" is not intended to be limiting, and both top and bottom walls may be referred to as end walls. Two mounting projections 304, 306 are formed as part of opposing sidewalls 108, 300, e.g. extending outward therefrom. However, it should be understood that any number of mounting projections could be implemented. In the illustrated example the mounting projections are proximate to diagonally opposing corners 308, 310 of the housing 102. Each mounting projection includes a slot 110 through which the shank of a fastener may be inserted. A flat shelf 204 proximate to the slot prevents the head of the fastener from passing through the slot. Consequently, the head of the fastener seats against the shelf to apply force against the projection, thereby securing the housing in place. A metal insert 112, e.g. a C-shaped washer, may be seated on the shelf in order to provide a more durable contact surface for the fastener. The metal insert may be adhered or press-fitted in place, among a variety of possible techniques.

The aluminum substrate layer forms a bottom (end) wall of the amplifier device. Bottom edges of the sidewalls contact the amplifier board. More particularly, a first bottom edge surface 312 of sidewall 108 and a second bottom edge surface 314 of sidewall 300 each contact the top outer edge of the amplifier board 200. The mounting projections 304, 306 may contact the side outer edge of the amplifier board, thereby providing lateral securing support along sidewalls 300, 108. The amplifier board may thus be held in place against a mounting surface by the housing. A bottom surface 316 of the amplifier board 200, i.e. the bottom surface of the aluminum substrate layer, extends beyond the bottom edges of the sidewalls of the housing 102 such that the housing does not inhibit thermally coupling the aluminum substrate layer to another surface such as a heat exchanger. Thus, the manufacturing tolerances for the amplifier board thickness and dimensions of the first and second bottom edge surfaces of the housing are not as demanding as they would be for a flush fit in which the bottom edges of the housing are in contact with the heat exchanger to which the amplifier is fastened. The housing is molded, machined or otherwise made from a plastic or other material that is resistant to heat and is more pliable than the aluminum substrate layer.

A flexible adhesive may be used to secure the controller board to the housing so that they remain coupled when the amplifier is not fastened to a surface. A wide variety of adhesives might be used, an example of which may include but is not limited to flexible epoxy. A variety of other techniques including but not limited to interference fit, friction fit or press fit between the aluminum substrate layer and the housing might be used. An uneven surface 320 may be molded or otherwise formed on an inside surface of the top wall of the housing. The uneven surface may include non-parallel surface that increase surface area and otherwise improve adhesion between the housing and the controller board via the flexible adhesive.

Figure 7:
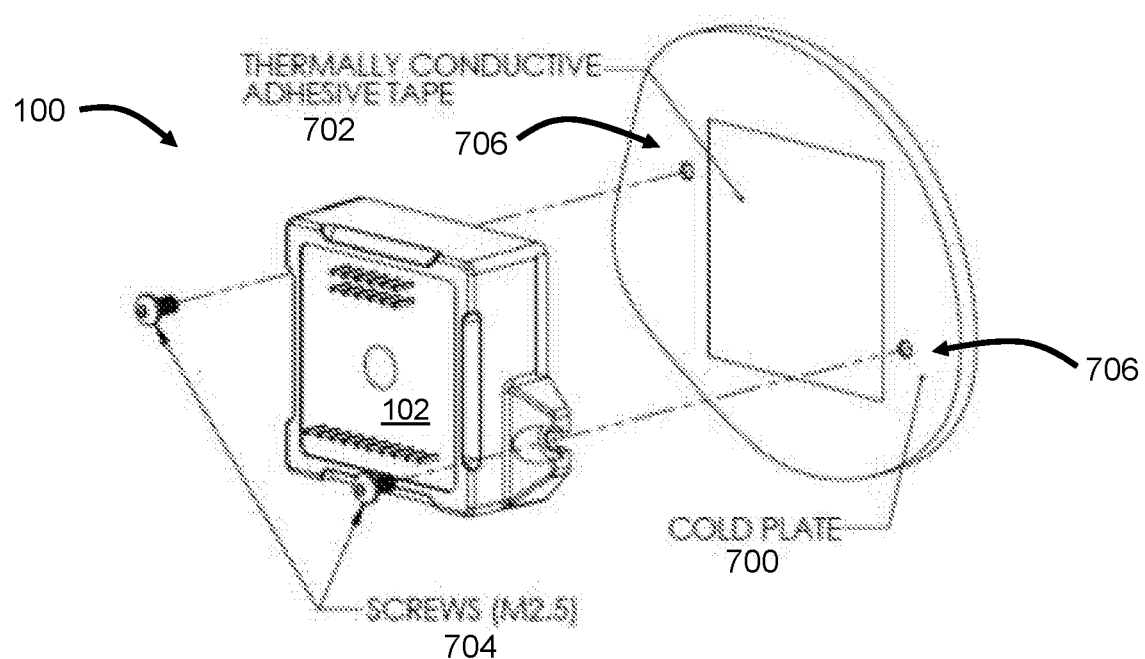
FIG. 7 illustrates the digital power amplifier mounted to a heat exchanger.

Referring to FIG. 7, the amplifier 100 may be mounted to a heat exchanger such as a support/cold plate 700 by thermally coupling the bottom surface of the aluminum substrate layer to the support/cold plate via a thermal transfer material 702. The thermal transfer material may include, for example and without limitation, thermally conductive tape, paste or gel. Fasteners 704 such as machine screws or bolts are inserted through the slots in the mounting projections and inserted into threaded holes 706 in the support/cold plate 700. As previously described, the bottom surface of the amplifier board, i.e. the bottom surface of the aluminum substrate layer, extends beyond the sidewalls of the housing 102 such that the housing does not inhibit thermally coupling the aluminum substrate layer to the support/cold plate 700.

Figure 8:
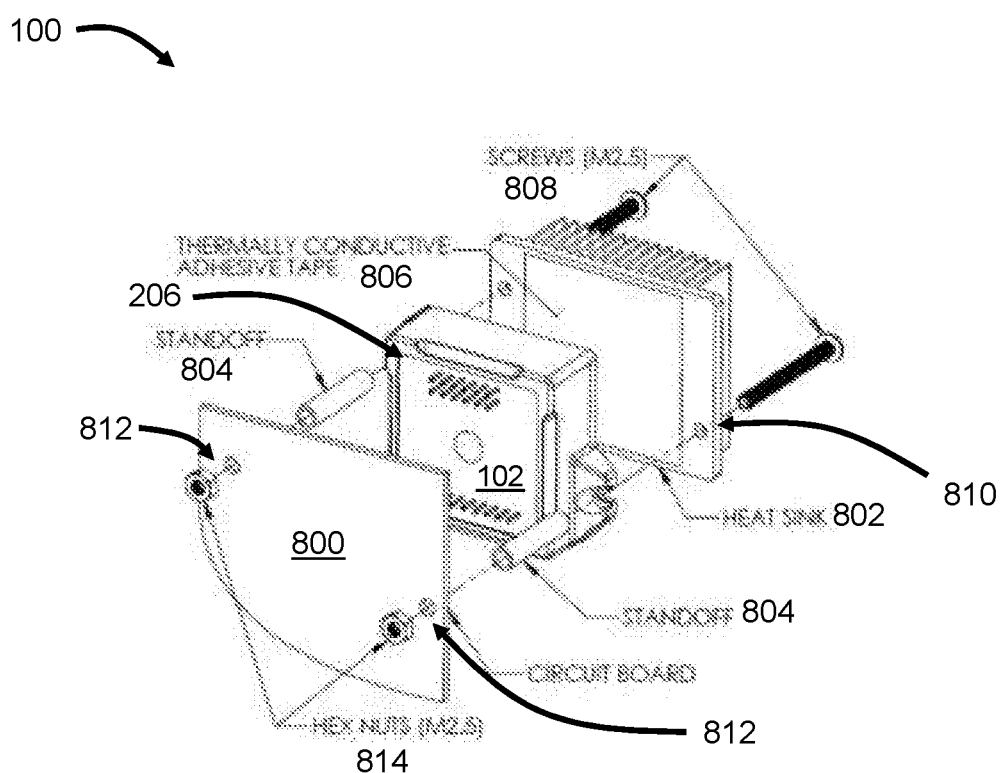
FIG. 8 illustrates the digital power amplifier mounted to a printed circuit board via standoffs.

Referring to FIG. 8, in another implementation the amplifier 100 is sandwiched between a printed circuit board 800 and a heat sink 802. The pins 206 extending from the controller board through the housing 102 are electrically coupled to an interface connector or vias on the printed circuit board 800. Standoffs 804 disposed between the printed circuit board 800 and mounting projections of housing 102 provide mechanical support for the amplifier. The heat sink 802 is thermally coupled to coupling the bottom surface of the aluminum substrate via a thermal transfer material 806. Fasteners 808 such as machine screws or bolts are inserted through holes 810 in the heatsink, through the slots in the mounting projections of the protective housing 102, through the standoffs 804, and inserted into holes 812 in the printed circuit board. Hex nuts 814 are threaded onto the fasteners on the opposite side of the printed circuit board from the amplifier.

Figure 9:
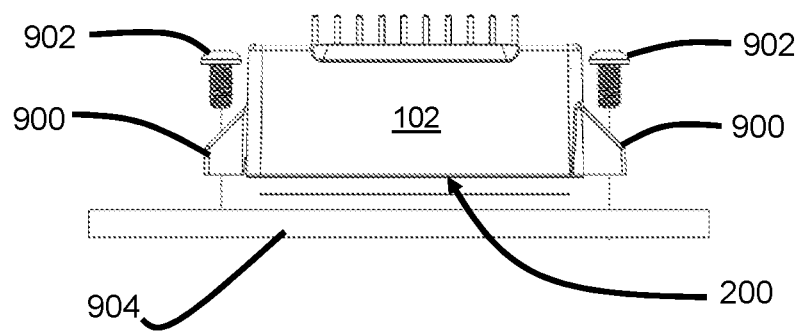
FIG. 9 illustrates thermal and mechanical isolation between the amplifier board and the fasteners.

As can be seen in FIG. 9, each mounting projection 900 provides at least partial mechanical and thermal isolation between the fastener 902 and the amplifier board 200. Force is applied to the amplifier board 200 by the fastener 902 through the projection 900 and the sidewalls of the housing 102. However, because the mounting projection extends outwardly from the housing sidewall, and because the housing is more pliable than the aluminum substrate layer, overtightening of the fastener causes deflection of the mounting projection without causing the amplifier board to deflect out-of-plane. Further, the housing sidewall may be deflected by expansion of the amplifier board in response to heat without causing the amplifier board to deflect out-of-plane. Further, the absence of direct contact between the aluminum substrate of the amplifier board 200, fastener 902 and heat exchanger 904 may help to avoid localized temperature deltas that might induce thermal expansion stresses. These features may be advantageous because deflection of the amplifier board that causes the circuit layer to become non-planar, or have localized stresses or expansion deltas, may result in damage to the components that are mounted thereon. Such damage may be particularly insidious when inflicted upon components such as the ceramic capacitors because small fractures in the ceramic material can lead to moisture intrusion which, over time, can cause the capacitor to fail in a short circuit type state. In the case of an amplifier that can cause catastrophic device failure. In addition to isolating material stresses caused by thermal effects, features may isolate localized material stress in the aluminum substrate that may be caused by direct contact of the fasteners with the aluminum substrate. This reduces the need for more precise monitoring of torque on the screws when attaching the amplifier unit to a heat sink or other circuit board.

A number of features, aspects, embodiments and implementations have been described. Nevertheless, it will be understood that a wide variety of modifications and combinations may be made without departing from the scope of the inventive concepts described herein. Accordingly, those modifications and combinations are within the scope of the following claims.

What is claimed is:

1. An apparatus comprising:
an electronic device comprising:
a first circuit board having only a single aluminum substrate layer via which the electronic device is configured to be thermally coupled to a heat exchanger and comprising a plurality of electronic components connected to a copper circuit layer that is disposed on a dielectric layer that is disposed on the single aluminum substrate layer;
a housing comprising a first end wall, a first sidewall, a second sidewall, a third sidewall, and a fourth sidewall, the first sidewall comprising a first mounting projection, and the second sidewall comprising a second mounting projection, the first mounting projection comprising a first opening for receiving a first fastener, the second mounting projection comprising a second opening for receiving a second fastener, wherein the first and second mounting projections provide at least partial mechanical isolation between the first and second fasteners and the first circuit board;
wherein bottom edges of the first sidewall, second sidewall, third sidewall and fourth sidewall contact a top outer edge of the copper circuit layer of the first circuit board and the first and second mounting projections contact first and second side outer edges of the copper circuit layer of the first circuit board, at least a portion of the single aluminum substrate layer extending beyond the bottom edges of the sidewalls of the housing, the single aluminum substrate layer forming a second end wall of the electronic device.

2. The apparatus of claim 1 wherein the first circuit board comprises an amplifier.

3. The apparatus of claim 2 wherein the electronic device further comprises a second circuit board coupled to the first circuit board, the second circuit board comprising a controller.

4. The apparatus of claim 3 wherein the second circuit board comprises pins that extend from the second circuit board through the housing.

5. The apparatus of claim 4 wherein the first opening comprises a slot through which a shank of the first fastener is inserted.

6. The apparatus of claim 5 comprising a flat shelf proximate to the slot.

7. The apparatus of claim 6 comprising a metal insert seated on the flat shelf.

8. The apparatus of claim 7 comprising a flexible adhesive that adheres the second circuit board to the housing.

9. The apparatus of claim 8 wherein the housing comprises an uneven surface to which the flexible adhesive is adhered.

10. A method comprising:
coupling a first circuit board to a heat exchanger, the first circuit board having only a single aluminum substrate layer configured to be thermally coupled to the heat exchanger and comprising a plurality of electronic components connected to a copper circuit layer that is disposed on a dielectric layer that is disposed on the single aluminum substrate layer, by:
placing the first circuit board in a housing, the housing comprising a first end wall, a first sidewall, a second sidewall, a third sidewall, and a fourth sidewall, the first sidewall comprising a first mounting projection, and the second sidewall comprising a second mounting projection, the first mounting projection comprising a first opening for receiving a first fastener, the second mounting projection comprising a second opening for receiving a second fastener, wherein bottom edges of the first sidewall, second sidewall, third sidewall and fourth sidewall contact a top outer edge of the copper circuit layer of the first circuit board and the first and second mounting projections contact first and second side outer edges of the copper circuit layer of the first circuit board, at least a portion of the single aluminum substrate layer extending beyond the bottom edges of the sidewalls of the housing, the single aluminum substrate layer forming a second end wall, the first and second mounting projections providing at least partial mechanical isolation between the first and second fasteners and the first circuit board; and
fastening the housing to the heat exchanger via the first and second mounting projections.

11. The method of claim 10 wherein the first circuit board comprises an amplifier, and comprising coupling a second circuit board to the first circuit board, the second circuit board comprising a controller.

12. The method of claim 11 wherein the second circuit board comprises pins that extend from the second circuit board through the housing, and comprising coupling a device to the second circuit board via the pins.

13. The method of claim 12 wherein the first opening includes a slot, and comprising inserting a shank of the first fastener through the slot.

14. The method of claim 13 comprising seating a head of the first fastener against a flat shelf proximate to the slot.

15. The method of claim 14 comprising seating the head of the first fastener against a metal insert seated against the flat shelf proximate to the slot.

16. The method of claim 15 comprising adhering the second circuit board to the housing with a flexible adhesive.

17. The method of claim 16 comprising adhering the flexible adhesive to an uneven surface formed on the housing.

18. A digital power amplifier device comprising:
a first circuit board having only a single aluminum substrate layer via which the first circuit board is configured to be thermally coupled to a heat exchanger and comprising an amplifier circuit that comprises a plurality of electronic components connected to a copper circuit layer that is disposed on a dielectric layer that is disposed on the single aluminum substrate layer;
a second circuit board coupled to the first circuit board, the second circuit board comprising a controller;
a housing comprising a first end wall, a first sidewall, a second sidewall, a third sidewall, and a fourth sidewall, the first sidewall comprising a first mounting projection, and the second sidewall comprising a second mounting projection, the first mounting projection comprising a first opening for receiving a first fastener, the second mounting projection comprising a second opening for receiving a second fastener, wherein the first and second mounting projections provide at least partial mechanical isolation between the first and second fasteners and the first circuit board;
wherein bottom edges of the first sidewall, second sidewall, third sidewall and fourth sidewall contact a top outer edge of the copper circuit layer of the first circuit board and the first and second mounting projections contact first and second side outer edges of the copper circuit layer of the first circuit board, at least a portion of the single aluminum substrate layer extending beyond the bottom edges of the sidewalls of the housing, the single aluminum substrate layer forming a second end wall of the electronic device; and wherein the second circuit board comprises pins that extend from the second circuit board through the housing.

19. The digital power amplifier device of claim 18 wherein the first opening comprises a slot through which a shank of the first fastener is inserted.

20. The digital power amplifier device of claim 19 comprising a metal insert seated against a flat shelf proximate to the slot.

* * * * *